(12) United States Patent
Deng et al.

(10) Patent No.: US 7,796,349 B2
(45) Date of Patent: Sep. 14, 2010

(54) MINIATURE IMAGE CAPTURE LENS

(75) Inventors: Jau-Jan Deng, Taipei (TW); Wei-Chung Chang, Taoyuan (TW); Min-Chih Liao, Taipei (TW)

(73) Assignee: VisEra Technologies Company Limited, Hsinchu (TW)

( * ) Notice: Subject to any disclaimer, the term of this patent is extended or adjusted under 35 U.S.C. 154(b) by 89 days.

(21) Appl. No.: 12/248,699

(22) Filed: Oct. 9, 2008

(65) Prior Publication Data

US 2010/0091386 A1  Apr. 15, 2010

(51) Int. Cl.
G02B 9/04 (2006.01)
(52) U.S. Cl. .................. 359/793; 359/756; 359/771; 359/795
(58) Field of Classification Search .......... 359/754–795
See application file for complete search history.

(56) References Cited

U.S. PATENT DOCUMENTS

| 7,342,731 | B2* | 3/2008 | Lee et al. ............... 359/772 |
| 7,457,053 | B2* | 11/2008 | Oh et al. ............... 359/793 |
| 7,474,480 | B2* | 1/2009 | Oh et al. ............... 359/794 |
| 2008/0113273 | A1* | 5/2008 | Jin et al. ............... 430/4 |
| 2009/0086339 | A1* | 4/2009 | Oh et al. ............... 359/764 |
| 2009/0323206 | A1* | 12/2009 | Oliver et al. ............... 359/776 |
| 2010/0002314 | A1* | 1/2010 | Duparre ............... 359/773 |
| 2010/0046096 | A1* | 2/2010 | Hirao et al. ............... 359/795 |

* cited by examiner

Primary Examiner—Darryl J Collins
(74) Attorney, Agent, or Firm—Muncy, Geissler, Olds & Lowe, PLLC

(57) ABSTRACT

A miniature image capture lens is disclosed, comprising an aperture diaphragm having an aperture through which an image is captured and a wafer-level lens system, comprising a first lens group including a first substrate, a first lens disposed on a first side of the first substrate and a second lens disposed on a second side of the first substrate, and a second lens group including a second substrate, a third lens disposed on a first side of the second substrate and a fourth lens disposed on a second side of the second substrate. The first lens, the second lens, the third lens and the fourth lens are aspherical and the miniature image capture lens meets the following condition:

$L/f_e < 1.6$;

$f_1/f_e = 0.5 \sim 1.5$;

$f_2/f_e = -1 \sim -3$;

$T_{group2}/T_{BFL} = 0.8 \sim 1.2$;

$T_{air}/T_{group2} = 0.4 \sim 0.8$;

L: total track length (TTL) from the first lens to an image plane
$f_e$: effective focal length of whole lens system
$f_1$: effective focal length of the first lens
$f_2$: effective focal length of the second lens
$T_{group2}$: thickness of the second lens group
$T_{air}$: distance between the second lens and the third lens
$T_{lens2}$: thickness of the second lens
$T_{lens2}$: thickness of the second lens
$T_{BFL}$: back focal length from the last lens surface to the image plane.

16 Claims, 8 Drawing Sheets

MINIATURE IMAGE CAPTURE LENS

BACKGROUND OF THE INVENTION

1. Field of the Invention

This invention relates to a lens system, and more particularly relates to a wafer-level miniature image capture lens.

2. Description of the Related Art

Mobile phones or personal computers employing imaging devices have become popular due to employment of solid-state image capture elements such as CCD (a charged coupled device) type image sensors, CMOS (a complementary metal oxide semiconductor) type image sensors and the like, allowing for higher performance and miniaturization of imaging devices. Additionally, there is demand for further miniaturization of image capture lenses loaded on the imaging devices.

However, despite demands, limits for further miniaturization of image capture lenses are being reached. As for the conventional image capture lenses, because they are true three dimensional (3-D) structures and sensors therein need to also be miniaturized, it is difficult to control accuracy of lateral shift and tilt for each lens surface nor to handle tiny lens during fabrication. Namely, tolerance is less.

FIG. 1 shows an imaging device using a published wafer-level lens module system. Light passes through the wafer-level lens modules 102 and 104 to the sensing element 106. In this art, the wafer-level lens modules 102 and 104 and the sensing element 106 can be fabricated by VLSI process technologies. Therefore, the image device can have a smaller size suitable for portable electronic devices, such as cell phones or personal digital assistants (PDAs). The wafer-level lens converts the true 3-Dimensional structure into a 2.5-Dimensional structure which stacks each lens plate into a lens cube. Thus, allowing for further miniaturization along with technological advances driven by semiconductor processes such as Moore's law, as accuracy control is better. Moreover, while conventional lenses are fabricated by a discrete process, which assembles the lenses one by one, in contrast, the wafer-level lens is fabricated by a batch process, which can stack thousands of lens on a lens plate into a lens module array, then singulate into a lens cube by a die-saw process. However, despite the smaller volume, conventional 3-D lens currently outperform wafer-level lenses. Additionally, it is relatively more difficult to design an optical lens system with small enough aberration, good enough modulation transfer function (MTF) for wafer-level lenses, especially when Nyquist frequency is higher, than for conventional three dimensional (3D) lenses. Therefore, a wafer-level lens system with comparable performance as a conventional 3D lens set is required.

BRIEF SUMMARY OF INVENTION

According to the issues described, the invention provides a miniature image capture lens, comprising an aperture diaphragm having an aperture through which an image is captured and a wafer-level lens system, comprising a first lens group including a first substrate, a first lens disposed on a first side of the first substrate and a second lens disposed on a second side of the first substrate, and a second lens group including a second substrate, a third lens disposed on a first side of the second substrate and a fourth lens disposed on a second side of the second substrate. The first lens, the second lens, the third lens and the fourth lens are aspherical and the miniature image capture lens meets the following condition:

$L/f_e < 1.6$;

$f_1/f_e = 0.5 \sim 1.5$;

$f_2/f_e = -1 \sim -3$;

$T_{group2}/T_{BFL} = 0.8 \sim 1.2$;

$T_{air}/T_{group2} = 0.4 \sim 0.8$;

L: total track length (TTL) from the first lens to an image plane
$f_e$: effective focal length of whole lens system
$f_1$: effective focal length of the first lens
$f_2$: effective focal length of the second lens
$T_{group2}$: thickness of the second lens group
$T_{air}$: distance between the second lens and the third lens
TBFL: back focal length from the last lens surface to the image plane.

BRIEF DESCRIPTION OF DRAWINGS

The invention can be more fully understood by reading the subsequent detailed description and examples with references made to the accompanying drawings, wherein.

DETAILED DESCRIPTION OF INVENTION

The following descriptions are of the contemplated mode of carrying out the invention. This descriptions are made for the purpose of illustrating the general principles of the invention and should not be taken in a limiting sense, not for limiting the invention.

Figure 1:
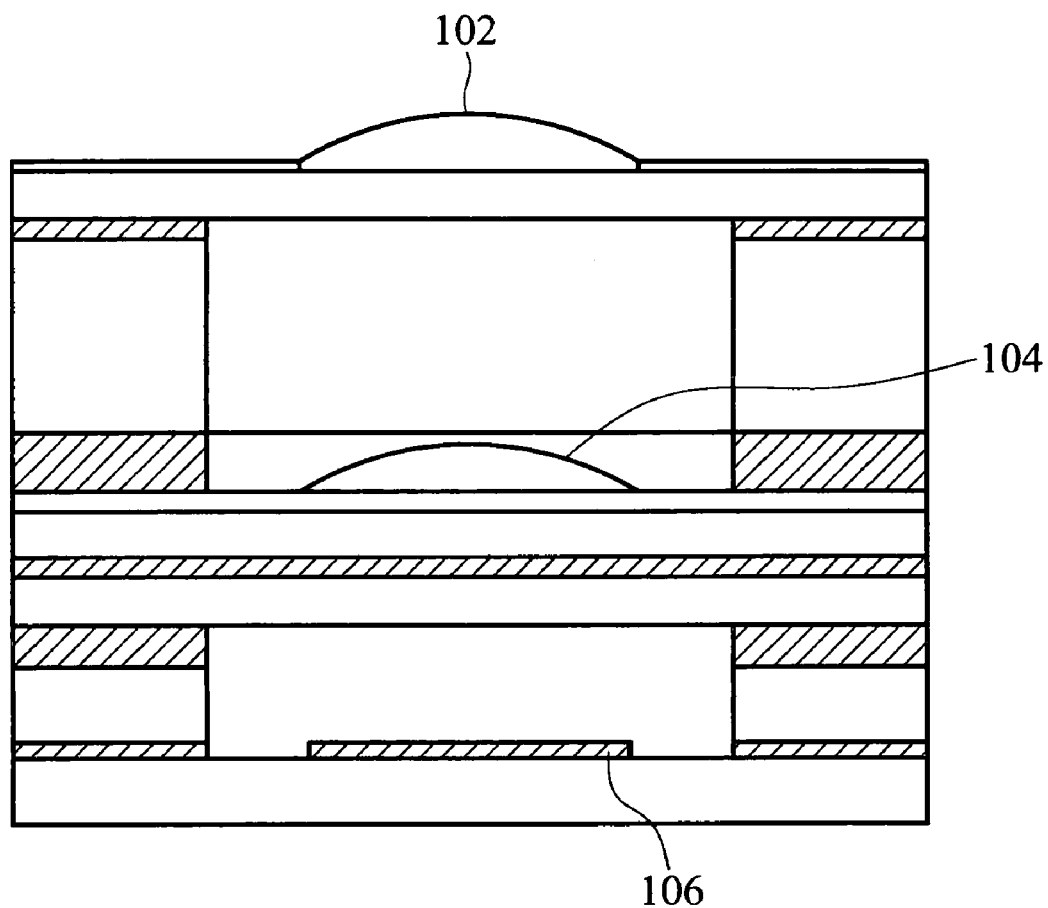
FIG. 1 shows an imaging device using a conventional wafer-level lens module system.
Figure 2:
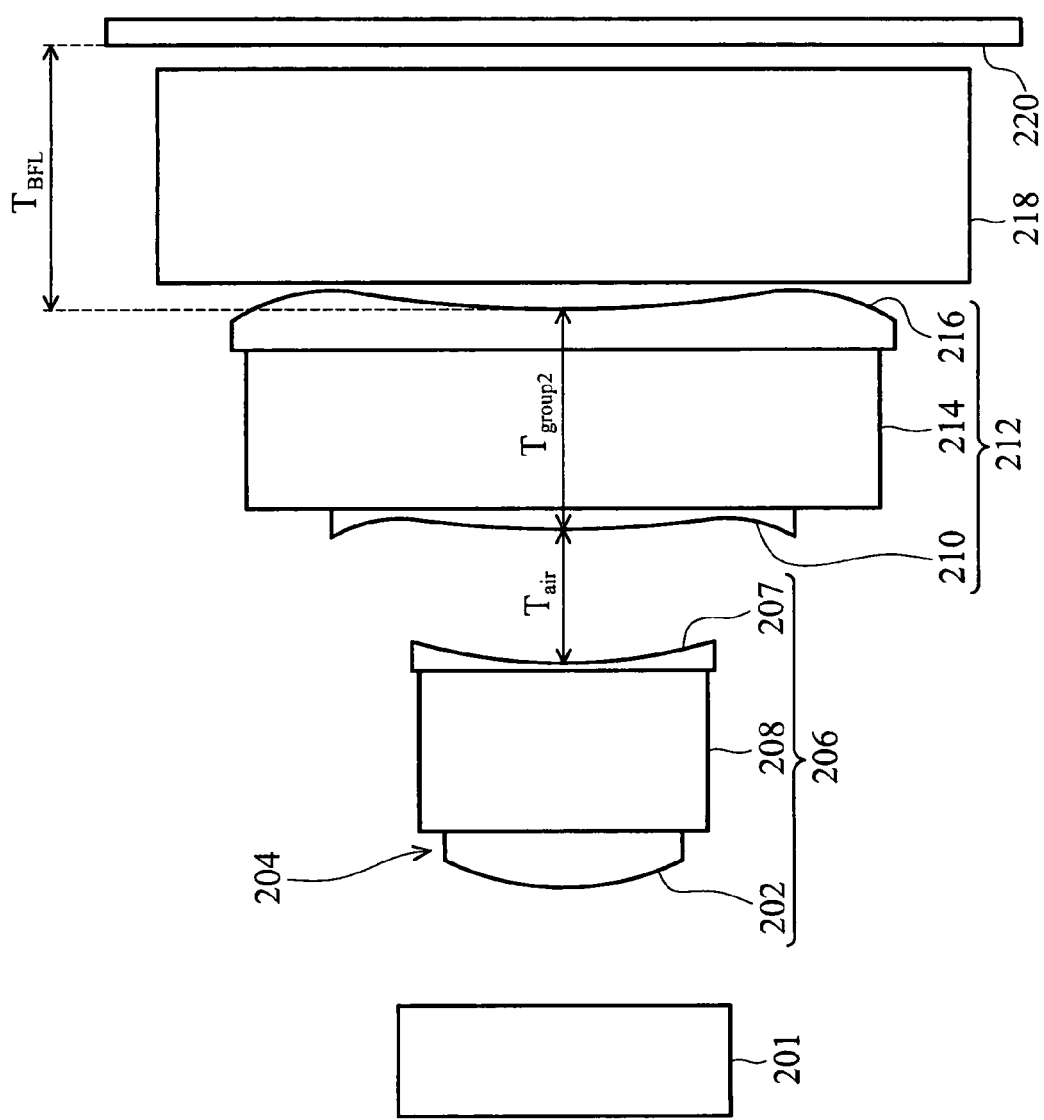
FIG. 2 shows a cross section view (y-z plane view) of a miniature image capture lens of an embodiment of the invention.

FIG. 2 shows a cross section view (y-z plane view) of a miniature image capture lens of an embodiment of the invention. This miniature image capture lens can capture an image of an object (not shown) and elements of the miniature image capture lens are described from the object to the image plane 220. First, a front cover glass 201 which can be coated with a UV/IR cut filter is provided. Next, a diaphragm 204 and a first lens (positive) are disposed on the first side of a first substrate 208 and a second lens 207 (negative) is disposed on the second side of a first substrate 208. The first lens 202, the first substrate 208 and the second lens 207 constitute a first lens group 206. A third lens 210 (positive) is disposed on the first side of a second substrate 214 and a fourth lens 216 (negative) is disposed on the second side of a second substrate 214. The third lens 210, the second substrate 214 and the fourth lens 216 constitute a second lens group 212. In the embodiment, the first lens group 206 behaves like a meniscus lens and the second lens group 212 behaves as a field corrector which can correct chief ray angle to match an image sensor.

Figure 3:
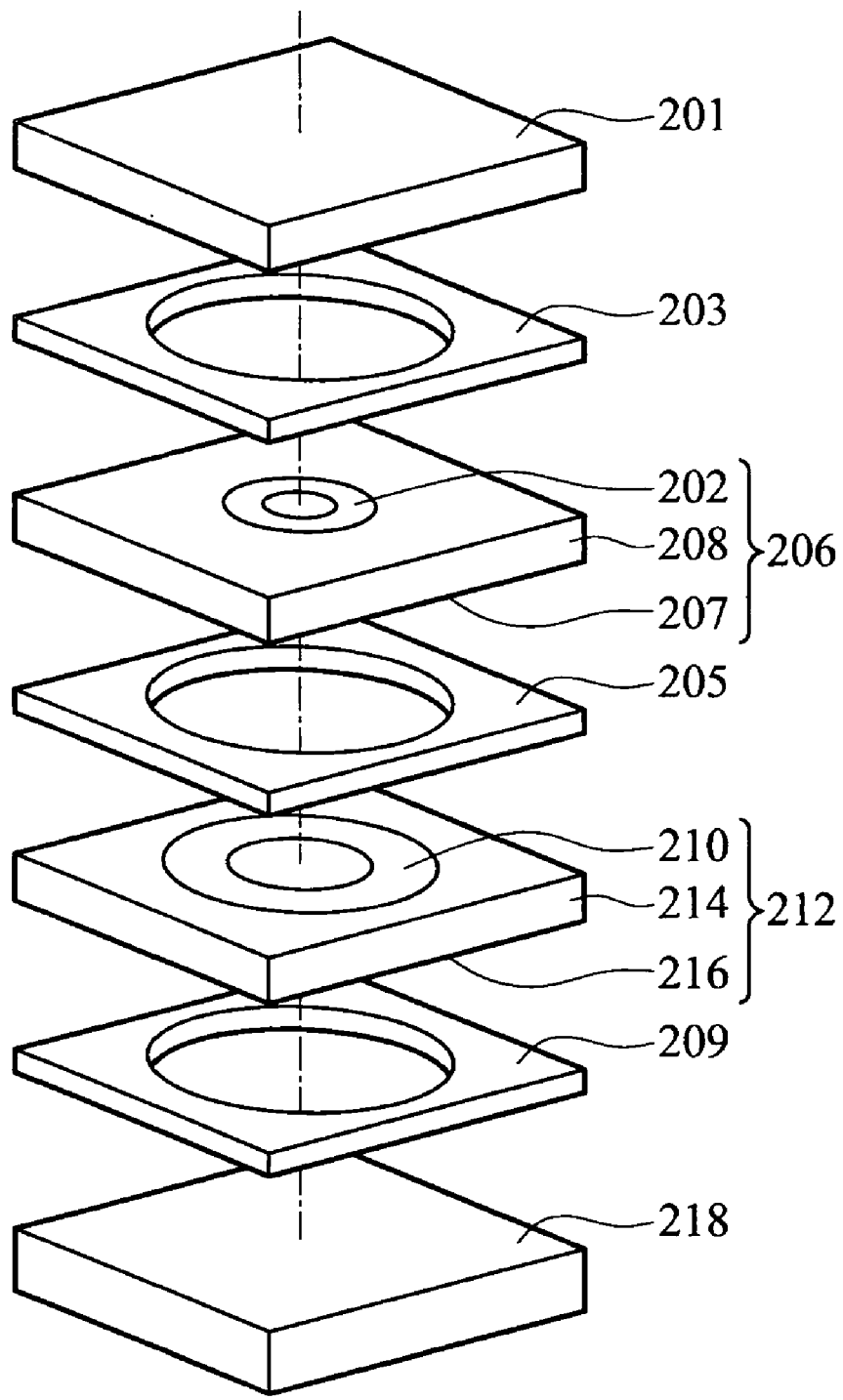
FIG. 3 shows an exploded view of the miniature image capture lens of the embodiment of FIG. 2.
Figure 4:
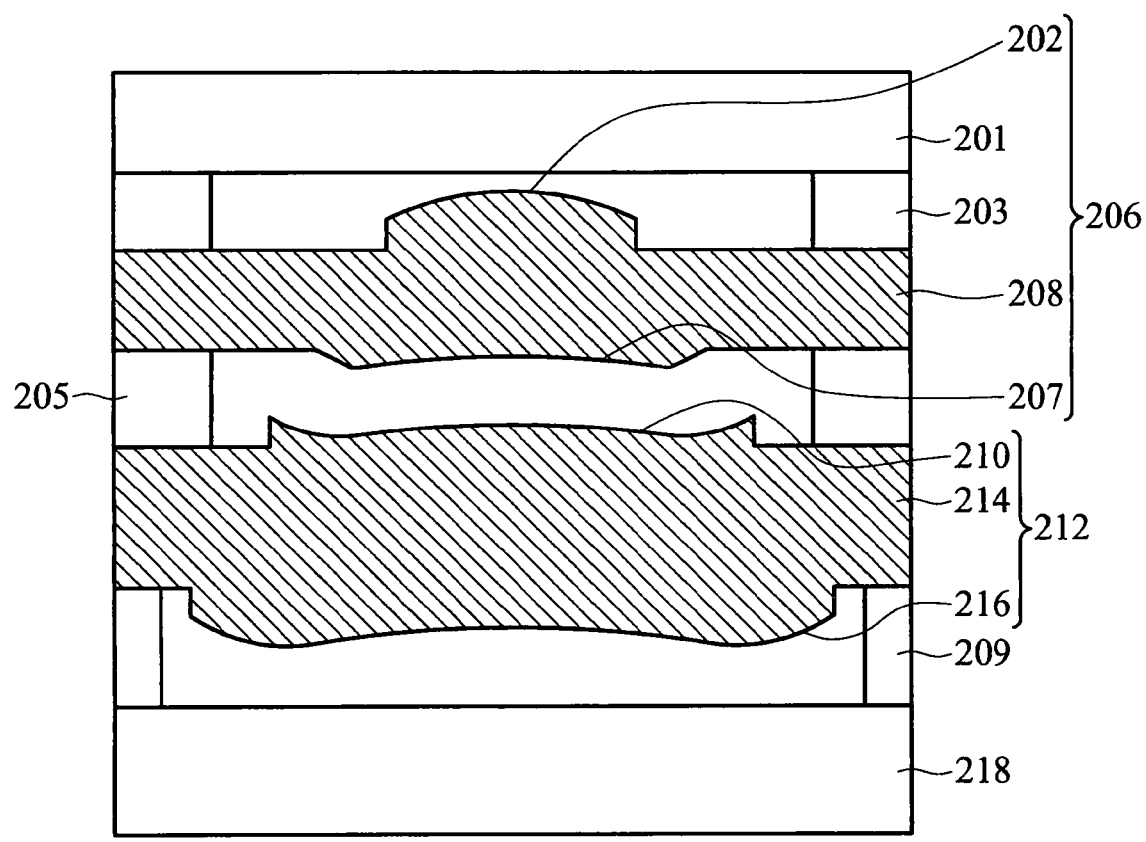
FIG. 4 shows a cross section of the miniature image capture lens of an embodiment of the invention.

Referring to FIG. 3 and FIG. 4, wherein FIG. 3 shows an exploded view of the miniature image capture lens of the embodiment of FIG. 2 and FIG. 4 shows a cross section of the miniature image capture lens of the embodiment of FIG. 2, the miniature image capture lens comprises a front cover glass 201, a spacer dam 203, a first lens group 206 including a first lens 202, a first substrate 208 and the second lens 207, a first spacer 205, and a second lens group 212 including a third lens 210, a second substrate 214 and the fourth lens 216, a second spacer 209, and a back cover glass 218 from the top side to the bottom side.

Specifically, the first lens, the second lens 207, third lens and the fourth lens 216 are aspherical and the following conditions are satisfied:

$L/f_e < 1.6;$ $f_1/f_e = 0.5 \sim 1.5;$ $f_2/f_e = -1 \sim -3;$ $T_{group2}/T_{BFL} = 0.8 \sim 1.2;$ $T_{air}/T_{group2} = 0.4 \sim 0.8;$ wherein L: total track length (TTL) from the first lens to an image plane
$f_e$: effective focal length of whole lens system
$f_1$: effective focal length of the first lens
$f_2$: effective focal length of the second lens
$T_{group2}$: thickness of the second lens group
$T_{air}$: distance between the second lens and the third lens
$T_{lens2}$: thickness of the second lens,
$T_{lens2}$: thickness of the second lens
TBFL: back focal length from the last lens surface to the image plane (include equivalent thickness of cover glass), wherein $$\frac{1}{f_i} \cong (n_i - 1)\left(\frac{1}{R_i} - \frac{1}{R_{i+1}}\right),$$

wherein
n: refraction index, and
R: radius if curvature of optical surface.

Specifically, in an example of the invention, the following condition is further satisfied:

$f_3/f_e > 0;$ $f_4/f_e < 0,$ wherein $f_3$: effective focal length of the third lens, and
$f_4$: effective focal length of the fourth lens.

In the embodiment, the first substrate 208 and the second substrate 214 can be glass plates which match the index of refraction of the lens materials and have thicknesses of about 300 μm or 400 μm. The spacers 303, 205, 209 can be a frosted glass or black high intensity plastic with drilled holes. A UV/IR cut filter and a diaphragm 204 can be made in a separated glass substrate, for example formed on the front cover glass, or integrated on the surface of first lens 202. The third lens 210 is for correction of chief ray angle incident onto a sensor.

In each example, the shape of the aspherical surface is shown by expression 1, in a perpendicular coordinate system, with the vertex of the surface being the origin, and the optical axial direction being the z-axis, as follows:

$$z = \frac{CR^2}{1 + \sqrt{1 - (1+K)r^2/R^2}} + \sum_{i=2}^{i=20} A_i r^i; \quad \text{expression 1}$$

wherein
C: vertex curvature,
K: Conic constant,
$A_i$: i-th order aspherical coefficients,
wherein, $r = \sqrt{x^2 + y^2}$.

Parameters of example 1 are illustrated in this paragraph, and they are as follows:
$f_e = 1.206$ mm;
L=1.54 mm;
$R_1 = 0.526$ mm; $R_2 = 1.285$ mm; $R_3 = 1.217$ mm; $R_4 = 1.615$ mm
$T_{BFL}$: 0.354 (include equivalent thickness of cover glass TC/G/nd=0.4/1.52=0.267)

$f_1/f_e = 1.02/1.206 = 0.85;$ $f_2/f_e = -2.48/1.206 = -2.06;$ $f_3/f_e = 2.34/1.206 = 1.95;$ $f_4/f_e = -3.12/1.206 = -2.58;$ $T_{group1} = 0.416$ mm; and $T_{air} = 0.258$ mm;

The surface data of each lens is illustrated in table 1.

TABLE 1

|  | Design Curve | | | |
|---|---|---|---|---|
|  | 1st Lens Group | | 2nd Lens Group | |
|  | 1st Lens | 2nd Lens | 3rd Lens | 4th Lens |
| C | 1.8288 | 0.8867 | 0.7400 | 0.5651 |
| Thickness | 0.557 | 0.015 | 1.0345 | 0.0843 |
| K | −22.0775 | 1.2605 | −65.7152 | 2.9461 |
| A2 | 0.000000 | 0.000000 | 0.000000 | 0.000000 |
| A4 | 15.1222 | 0.1651 | 0.0820 | −0.5107 |
| A6 | −314.9067 | 35.3596 | −13.0676 | −2.2110 |
| A8 | 4791.373 | −274.5931 | 51.1782 | 2.6632 |
| A10 | −32076.631 | 1566.141 | −102.3019 | −1.8504 |

Figure 5A:
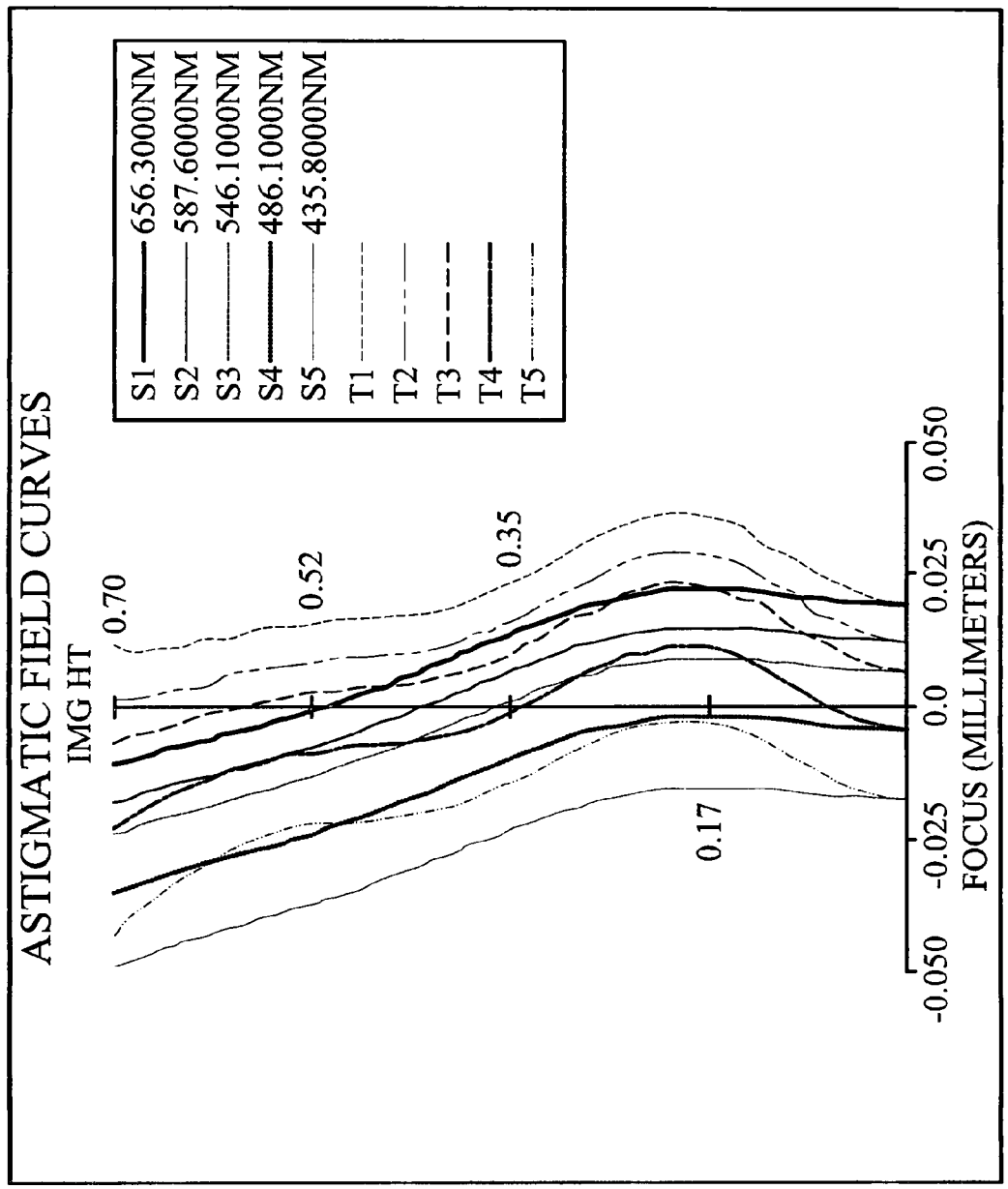
FIG. 5A shows a drawing of astigmatic field curves under various wave length conditions of an example of the invention.
Figure 5B:
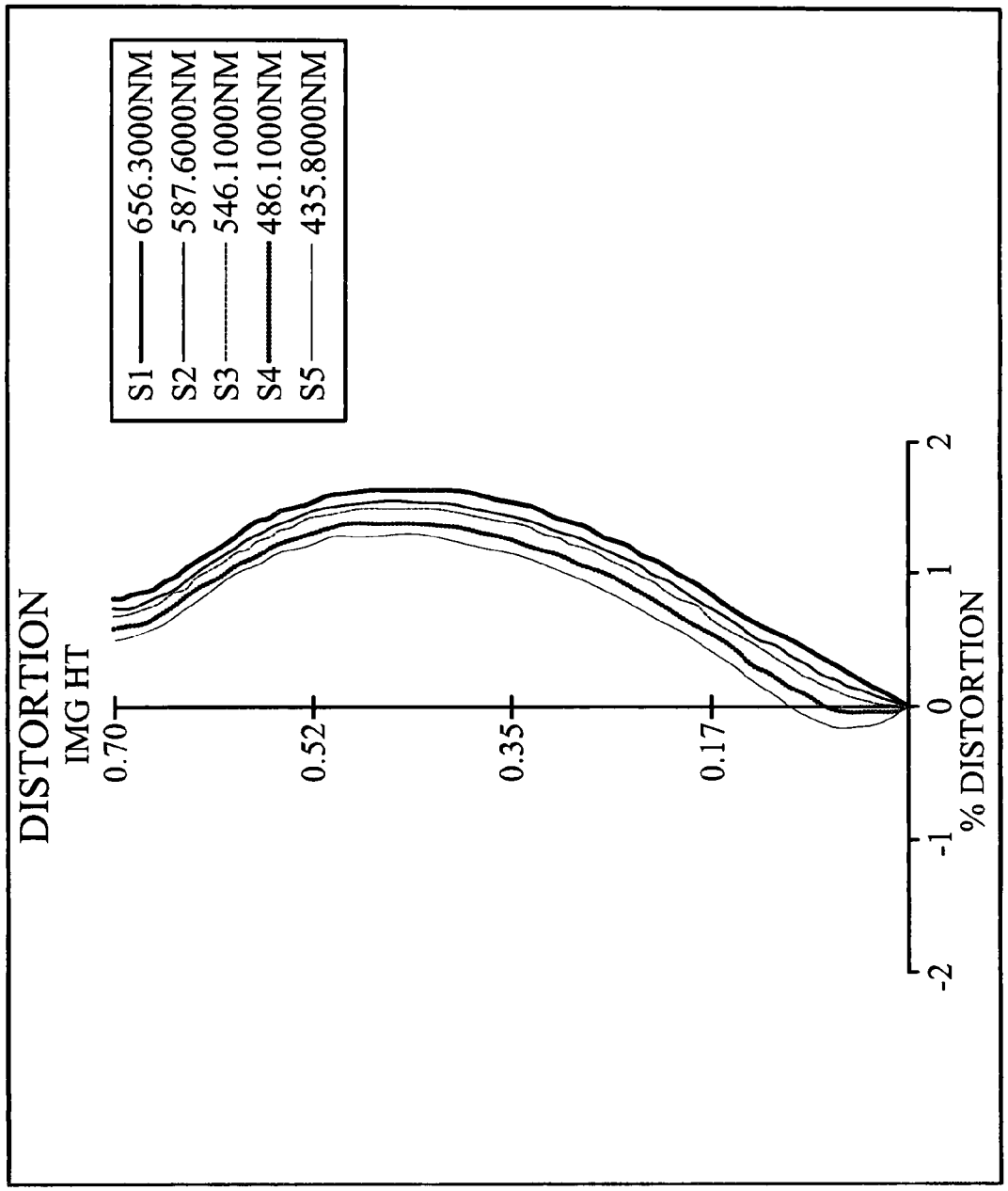
FIG. 5B shows a drawing of distortion curves under various wave length conditions of an example of the invention.
Figure 5C:
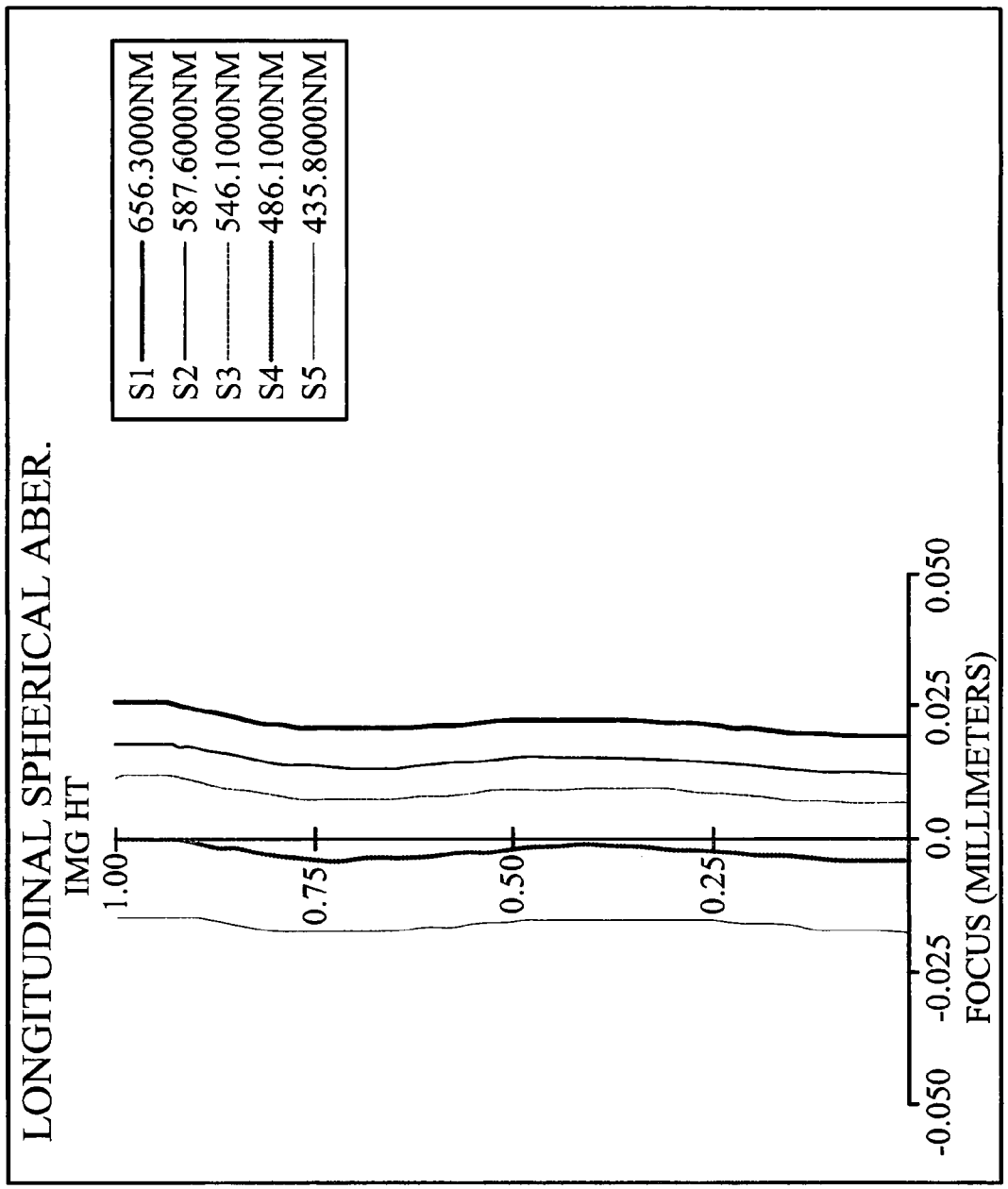
FIG. 5C shows a drawing of a spherical aberration of an example of the invention.
Figure 5D:
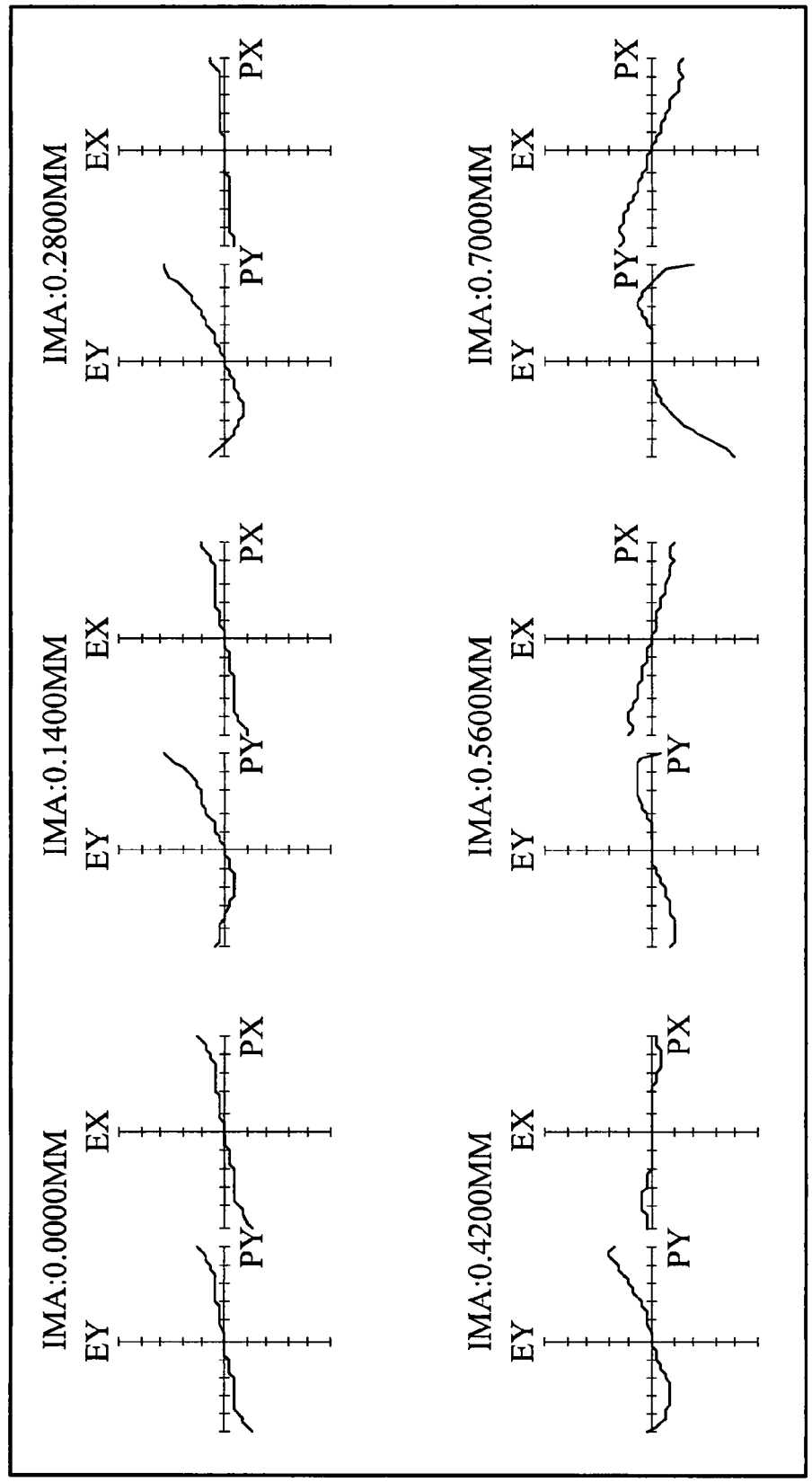
FIG. 5D shows a drawing of a coma aberration of an example of the invention.

FIG. 5A shows a drawing of astigmatic field curves under various wave length conditions of the example, in which the lines S1~S5 show sagittal lines and the lines T1~T5 shows tangential lines. As shown in FIG. 5A, the present example can present astigmatic aberration substantially less than 0.03 mm. FIG. 5B shows a drawing of distortion curves under various wave length conditions of the example. FIG. 5C shows a drawing of a spherical aberration of the example. FIG. 5D shows a drawing of a coma aberration of the example. The miniature image capture lens of the embodiment can have good aberration performance in accordance with the results shown in FIGS. 5A~5D.

According to the description above, the invention can provide a high performance wafer-level lens which has comparable lens performance with conventional lens and the lens set is reflow solderable in a Pb-free soldering process.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A miniature image capture lens, comprising:
   an aperture diaphragm having an aperture through which an image is captured; and
   a wafer-level lens system, comprising:
      a first lens group, including:
         a first substrate;
         a first lens disposed on a first side of the first substrate;
         a second lens disposed on a second side of the first substrate
      a second lens group, including:
         a second substrate;
         a third lens disposed on a first side of the second substrate;
         a fourth lens disposed on a second side of the second substrate,
      wherein the first lens, the second lens, the third lens and the fourth lens are aspherical and the miniature image capture lens meets the following conditions:

$L/f_e < 1.6;$ $f_1/f_e = 0.5 \sim 1.5;$ $f_2/f_e = -1 \sim -3;$ $T_{group2}/T_{BFL} = 0.8 \sim 1.2;$ and $T_{air}/T_{group2} = 0.4 \sim 0.8,$ wherein L: total track length (TTL) from the first lens to an image plane,
   $f_e$: effective focal length of whole lens system,
   $f_1$: effective focal length of the first lens,
   $f_2$: effective focal length of the second lens,
   $T_{group2}$: thickness of the second lens group,
   $T_{air}$: distance between the second lens and the third lens, and
   $T_{lens2}$: thickness of the second lens,
   $T_{lens2}$: thickness of the second lens, and
   $T_{BFL}$: back focal length from the last lens surface to the image plane.

2. The miniature image capture lens as claimed in claim 1, wherein $f_3/f_e > 0$, $f_3$: effective focal length of the third lens.

3. The miniature image capture lens as claimed in claim 1, wherein $f_4/f_e < 0$, $f_4$: effective focal length of the fourth lens.

4. The miniature image capture lens as claimed in claim 1, wherein the first lens is a positive lens.

5. The miniature image capture lens as claimed in claim 1, wherein the second lens is a negative lens.

6. The miniature image capture lens as claimed in claim 1, wherein the third lens is a positive lens.

7. The miniature image capture lens as claimed in claim 1, wherein the fourth lens is a negative lens.

8. The miniature image capture lens as claimed in claim 1, wherein the first lens group behaves like a meniscus lens.

9. The miniature image capture lens as claimed in claim 1, wherein and the second lens group behaves as a field corrector which corrects chief ray angle to match an image sensor.

10. The miniature image capture lens as claimed in claim 1, further comprising a spacer between the first lens group and the second lens group.

11. The miniature image capture lens as claimed in claim 10, wherein the spacer is a frosted glass or black high intensity plastic with drilled holes.

12. The miniature image capture lens as claimed in claim 10, further comprising a back cover glass below the fourth lens.

13. The miniature image capture lens as claimed in claim 12, further comprising a second spacer between the second lens group and the back cover glass.

14. The miniature image capture lens as claimed in claim 1, further comprising a front cover glass over the a first lens.

15. The miniature image capture lens as claimed in claim 14, further comprising a UV/IR cut filter formed on the front cover glass.

16. The miniature image capture lens as claimed in claim 1, further comprising a UV/IR cut filter formed on the first lens.

* * * * *